United States Patent
Taylor et al.

(10) Patent No.: US 11,444,234 B2
(45) Date of Patent: *Sep. 13, 2022

(54) METHOD FOR CREATING HIGH-RESOLUTION MICRO- TO NANO-SCALE STRUCTURES ON FLEXIBLE SUBSTRATES

(71) Applicant: THE UNITED STATES OF AMERICA AS REPRESENTED BY THE SECRETARY OF THE NAVY, San Diego, CA (US)

(72) Inventors: Benjamin J. Taylor, Escondido, CA (US); Teresa H. Emery, San Diego, CA (US)

(73) Assignees: United States of America as represented by the Secretary of the Navy, Washington, DC (US); the Navy, Washington, DC (US)

( * ) Notice: Subject to any disclaimer, the term of this patent is extended or adjusted under 35 U.S.C. 154(b) by 458 days.

This patent is subject to a terminal disclaimer.

(21) Appl. No.: 16/716,179

(22) Filed: Dec. 16, 2019

(65) Prior Publication Data
US 2021/0184098 A1 Jun. 17, 2021

(51) Int. Cl.
*H01L 39/24* (2006.01)
*B82Y 30/00* (2011.01)

(52) U.S. Cl.
CPC ........ *H01L 39/2454* (2013.01); *H01L 39/249* (2013.01); *H01L 39/2467* (2013.01); *B82Y 30/00* (2013.01)

(58) Field of Classification Search
CPC ............. H01L 39/2454; H01L 39/2467; H01L 39/249
See application file for complete search history.

(56) References Cited

U.S. PATENT DOCUMENTS

| 6,630,395 B1 * | 10/2003 | Kane ................. H01L 21/76831 438/618 |
| 10,283,695 B1 * | 5/2019 | Taylor .................. H01L 39/126 |
| 2004/0023810 A1 * | 2/2004 | Ignatiev ............. H01L 39/2461 505/100 |

OTHER PUBLICATIONS

Taylor et al. "Correlation of structural, magnetic, and electronic transitions of a novel charge-gradient YBa2Cu3Ovx film." Physical Revie B 91, 144511. (Year: 2015).*
Taylor et al. "Preparation of novel HTS films and tunnel junctions for advanced C3I sensor applications." SPIE vol. 9467 946725-1. (Year: 2015).*

* cited by examiner

*Primary Examiner* — Paul A Wartalowicz
(74) *Attorney, Agent, or Firm* — Naval Information Warfare Center, Pacific; Kyle Eppele; Matthew D. Pangallo

(57) ABSTRACT

A method includes providing a film of a high-temperature superconductor compound on a flexible substrate, where a portion of the film has a first oxygen state, and exposing a portion of the film to a focused ion beam to create a structure within the film. The structure may result from the portion of the film being partially or completely removed. The structure may be a trench along the length or width of the film. The method may include annealing the exposed portion of the film to a second oxygen state. The oxygen content of the second oxygen state may be greater or less than the oxygen content of the first oxygen state.

13 Claims, 4 Drawing Sheets

METHOD FOR CREATING HIGH-RESOLUTION MICRO- TO NANO-SCALE STRUCTURES ON FLEXIBLE SUBSTRATES

FEDERALLY SPONSORED RESEARCH AND DEVELOPMENT

The Method for Creating High-Resolution Micro- to Nano-Scale Structures on Flexible Substrates is assigned to the United States Government. Licensing inquiries may be directed to Office of Research and Technical Applications, Space and Naval Warfare Systems Center, Pacific, Code 72120, San Diego, Calif., 92152; telephone (619) 553-5118; email: ssc_pac_t2@navy.mil. Reference Navy Case No. 109943.

BACKGROUND

Current methods for producing high-resolution structural features in films of high-temperature superconducting (HTS) materials, such as $YBa_2Cu_3O_x$ (YBCO), include using the focused ion-beam milling method for films deposited on single crystal substrates, which are inflexible. Some fabrication techniques can enable the production of new superconducting devices and interconnects for use in cryogenic systems including RF signal detection and transmission, microwave transmission lines, and quantum information. There is a need to reliably produce high-resolution microstructure features in films of YBCO grown on flexible yttria stabilize zirconia (YSZ) substrates, and more specifically a need for lossless high-speed interconnects between components and cooling stages with complex cryogenic systems, particularly for those having a temperature greater than 10 degrees kelvin operating stages.

DETAILED DESCRIPTION OF SOME EMBODIMENTS

Reference in the specification to "one embodiment" or to "an embodiment" means that a particular element, feature, structure, or characteristic described in connection with the embodiments is included in at least one embodiment. The appearances of the phrases "in one embodiment", "in some embodiments", and "in other embodiments" in various places in the specification are not necessarily all referring to the same embodiment or the same set of embodiments.

Some embodiments may be described using the expression "coupled" and "connected" along with their derivatives. For example, some embodiments may be described using the term "coupled" to indicate that two or more elements are in direct physical or electrical contact. The term "coupled," however, may also mean that two or more elements are not in direct contact with each other, but yet still co-operate or interact with each other. The embodiments are not limited in this context.

As used herein, the terms "comprises," "comprising," "includes," "including," "has," "having" or any other variation thereof, are intended to cover a non-exclusive inclusion. For example, a process, method, article, or apparatus that comprises a list of elements is not necessarily limited to only those elements but may include other elements not expressly listed or inherent to such process, method, article, or apparatus. Further, unless expressly stated to the contrary, "or" refers to an inclusive or and not to an exclusive or.

Additionally, use of the "a" or "an" are employed to describe elements and components of the embodiments herein. This is done merely for convenience and to give a general sense of the invention. This detailed description should be read to include one or at least one and the singular also includes the plural unless it is obviously meant otherwise.

The embodiments of the methods described herein may be used for the production of high-resolution structural features in films of high-Temperature (high-Tc) superconducting compounds deposited on flexible substrates, and the use of either a focused ion-beam (FIB) milling system and/or the use of an ion-flood gun in conjunction with lithographically and/or hard-masked films. One example of the type of structure that may be created is a trench along the film. The high-resolution, sharp profile on ion-milled trenches are observed to form under direct, unmasked exposure of YBCO film to a focused ion beam when the film has oxygen concentrations at and below the concentration of $x\approx6.72$. The structures may be relatively large (~100 µm) or small (~10 nm). The ability to produce nm-scale structures is relevant to the production of superconducting high-frequency radio frequency (RF) high-power films of YBCO.

Figure 1A:
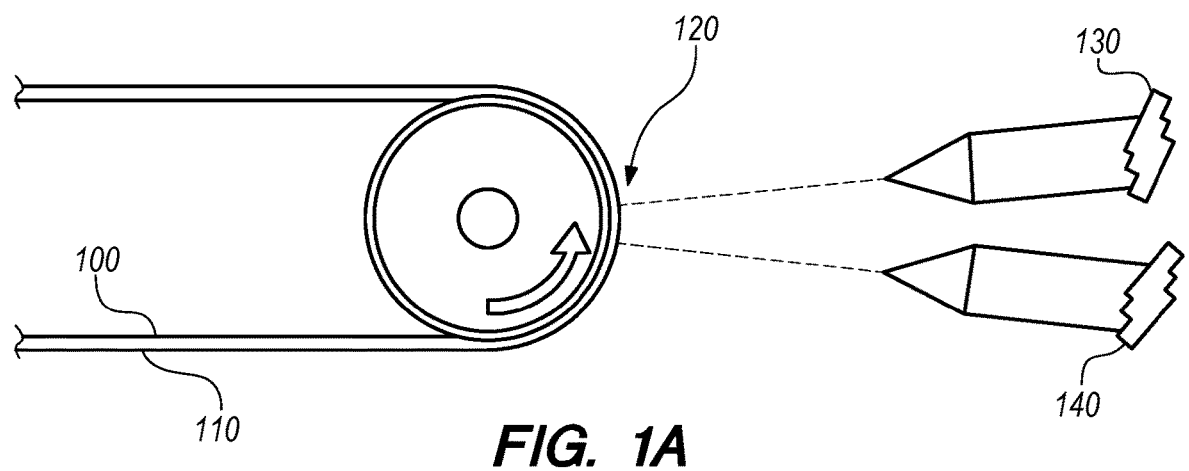
FIG. 1A shows a depiction of a reel-to-reel unmasked FIB milling process for the fabrication of very high frequency superconducting RF transmission lines in accordance with the method for creating high-resolution micro- to nano-scale structures on flexible substrates.
Figure 1B:
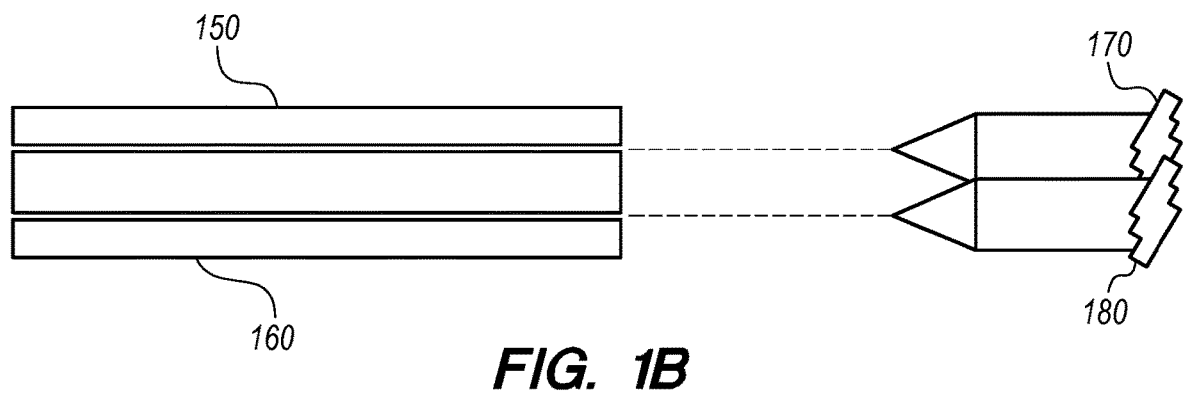
FIG. 1B shows a top view of sub-micron milled YBCO conductor on a flexible substrate, with Argon focused ion beams in accordance with the method for creating high-resolution micro- to nano-scale structures on flexible substrates.

FIG. 1A shows a depiction of a reel-to-reel unmasked FIB milling process for the fabrication of very high frequency superconducting RF transmission lines. FIG. 1A shows a YBCO film 100 grown on a flexible substrate 110. The process can be modified to create direct-write circuits or circuit paths on sections of film 100. An ion beam 120 can be adjusted to control milled trench width, focused ion beam settings and rate at which tape turns determines the depth of milled features, such as a sub-micron wide trench. Argon ion focused ion beam 130 and Argon ion focused ion beam 140 are examples of focused ion beams that will remove some regions, either entirely or partially, to form transmission lines, circuit paths, and other functional structures. FIG. 1B shows a top view of sub-micron milled YBCO conductor 150 on flexible substrate 160, with Argon focused ion beams 170 and 180.

Figure 2:
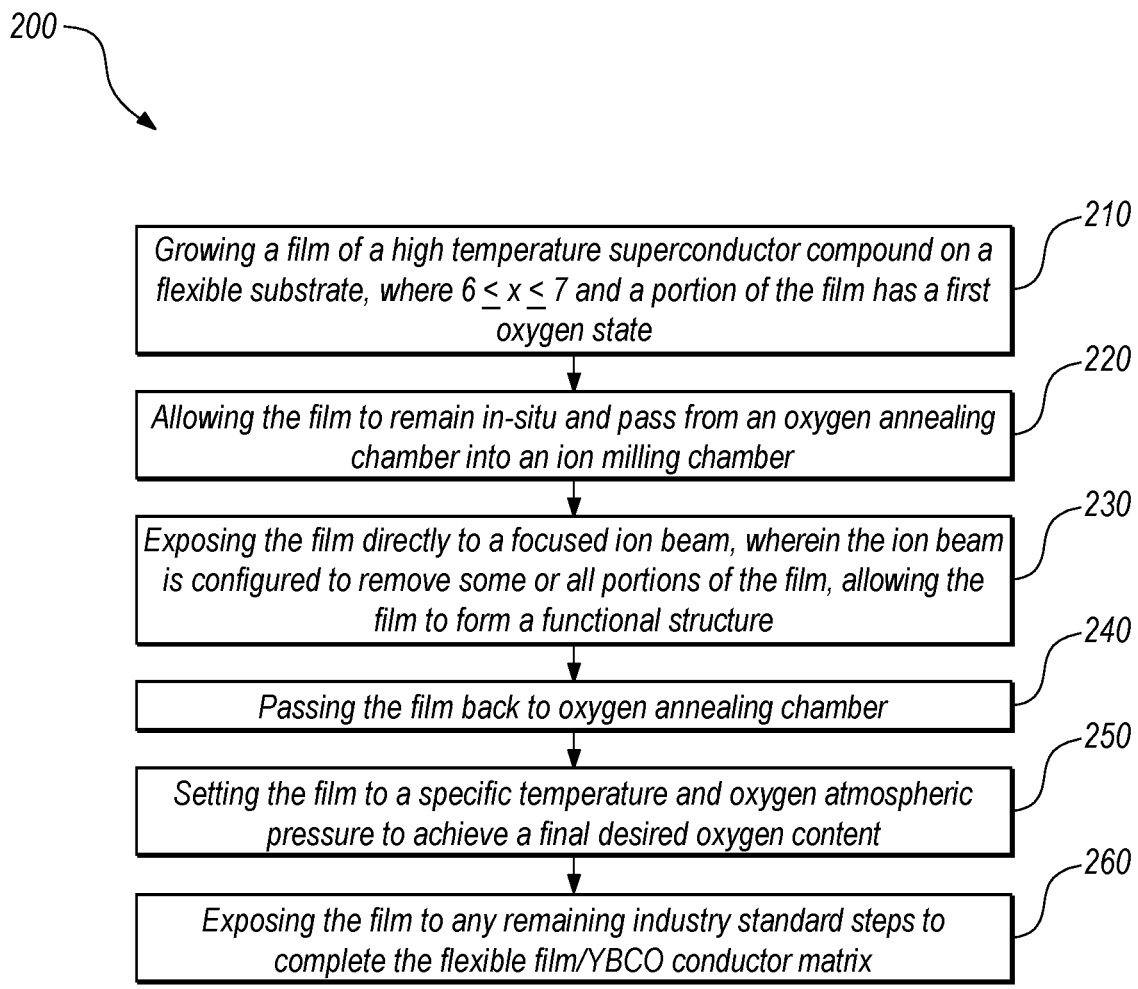
FIG. 2 shows the steps in the reel-to-reel unmasked FIB milling process for the fabrication of very high frequency superconducting radio frequency transmission lines.

FIG. 2 shows a flow-chart 200 for the fabrication of very high frequency superconducting RF transmission lines demonstrating the steps that may be utilized: For step 210, growth upon a flexible substrate matrix of a YBCO film or tape having a uniform low oxygen content, either below x≈6.72 or 6.33, as desired in an industry standard reel-to-reel superconducting tape process or system. For step 220, the tape or film will remain in-situ and pass from the oxygen annealing chamber and into an ion milling chamber. For step 230, the YBCO film or tape is then exposed directly to a focused ion beam and/or set of focused ion beams to completely remove some regions entirely, and other regions partially, to form transmission lines, circuit paths, and other functional structures. For step 240, the tape or film is subsequently passed to the annealing chamber. For step 250, the film temperature and oxygen atmospheric pressure are set to achieve the desired final oxygen content (typically x≈6.91). For step 260, the tape or film is then exposed to any remaining industry standard steps to complete the flexible tape/YBCO conductor matrix.

Figure 3:
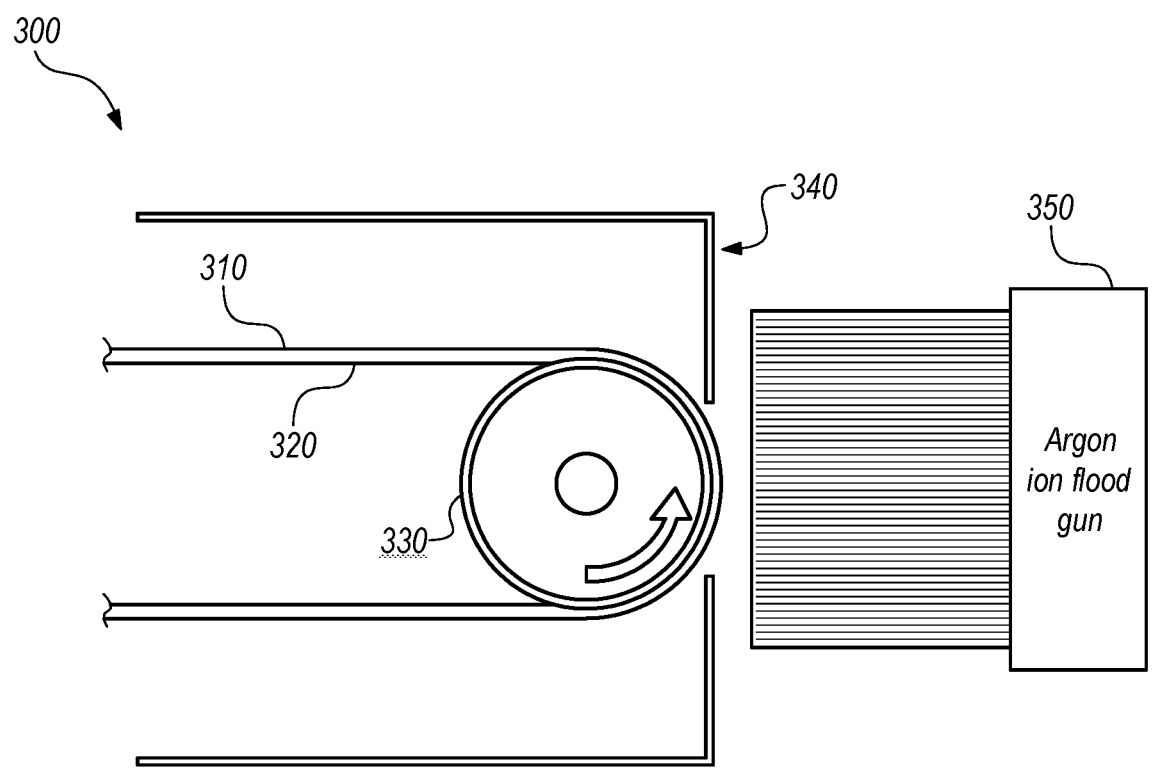
FIG. 3 shows a side view of a depiction of a reel-to-reel, lithographically masked tape, shielded ion gun configuration for ion milling YBCO on flexible substrates for the fabrication of very high frequency superconducting RF transmission lines.

FIG. 3 shows a depiction 300 of a reel-to-reel, lithographically masked tape/film, shielded gun configuration for ion milling YBCO on flexible substrates for the fabrication of very high superconducting RF transmission lines. FIG. 3 shows a YBCO film 310 on a hard masked flexible substrate 320. The temperature of film 310 is controlled by contact with a cooled wheel 330. Cooling of film 310 is needed to prevent change in oxygen stoichiometry during the ion-gun milling process. A shield 340 limits the ion milling region of YBCO on film 310. An argon ion flood gun 350 is used, along with the rate at which film 310 turns, to determine the depth of milled features.

Figure 4:
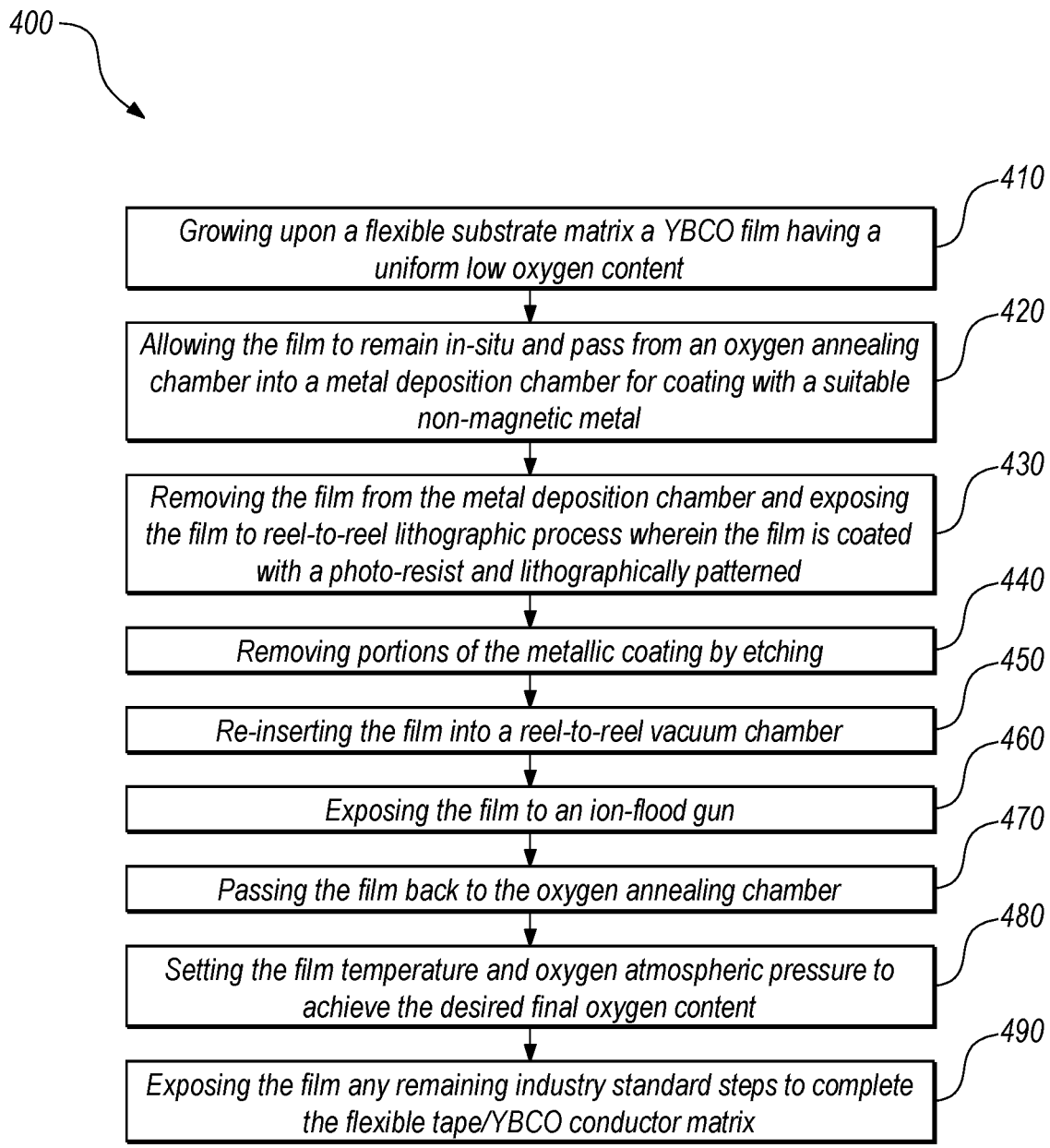
FIG. 4 shows the steps in the method for reel-to-reel, lithographically masked tape, shielded ion gun configuration for ion milling YBCO on flexible substrates for the fabrication of very high frequency superconducting RF transmission lines.

FIG. 4 shows an alternate flow-chart 400 for the fabrication of very high frequency superconducting RF transmission lines using lithographically mixed tape and an open ion gun configuration for ion milling YBCO on flexible substrates with the following steps: For step 410, growth upon a flexible substrate matrix of a YBCO film having a uniform low oxygen content, either below x≈6.72 or 6.33, as desired in an industry standard reel-to-reel superconducting tape process or system. For step 420, the tape or film will remain in-situ and pass from the oxygen annealing chamber and into a metal deposition chamber for coating with a suitable non-magnetic metal such as gold or titanium. For step 430, the tape or film is removed and exposed to a reel-to-reel lithographic process wherein the tape or film is coated with a photo-resist and subsequently lithographically patterned. For step 440, portions of the metallic coating are removed by etching. For step 450, the tape or film is then re-inserted into a reel-to-reel vacuum chamber or system and for step 460, subsequently exposed to an ion-flood gun to completely remove some regions entirely, and other regions partially, to form transmission lines, circuit paths, and other structures. For step 470, the film is then passed to the annealing chamber and for step 480, the film temperature and oxygen atmospheric pressure are set to achieve the desired final oxygen content (typically x≈6.91). For step 490, the tape or film is then exposed to any remaining industry standard steps to complete the flexible tape/YBCO conductor matrix.

The methods described herein are applicable to other compounds with diffusive constituent atoms or molecules having well-ordered low-dimensional sub-lattice structures. An electric field may be applied during the oxygen annealing process wherein the film oxygen content is set to be below x≈6.72 for the purpose of aligning the YBCO crystal lattice along a specified direction. The use of a lithographic mask and ion million of YBCO films is well established, however the process is typically carried out at an optimal oxygen concentration. In the methods described herein, the oxygen concentrations are controlled to a specific concentration.

Many modifications and variations of the embodiments disclosed herein are possible in light of the above description. Within the scope of the appended claims, the disclosed embodiments may be practiced otherwise than as specifically described. Further, the scope of the claims is not limited to the implementations and embodiments disclosed herein, but extends to other implementations and embodiments as may be contemplated by those having ordinary skill in the art.

The invention claimed is:

1. A method comprising the steps of:
providing a film on a flexible substrate in an oxygen annealing chamber, the film comprising a high-temperature superconductor compound belonging to the class of compounds having a compositional form of $R_{1-y}M_yBa_2Cu_{3-z}T_zO_x$, where x is oxygen content and $6 \leq x \leq 7$, wherein $0 < y \leq 1$, where $0 < z \leq 1$, where R comprises at least one of a rare earth and calcium, where M comprises at least one of a rare earth distinct from that of R and calcium if absent from R, where T comprises at least one of cobalt (Co), iron (Fe), nickel (Ni), and zinc (Zn), wherein at least one portion of the film has a first oxygen state having an oxygen content that is approximately less than or equal to 6.72;
allowing the film to remain in-situ and pass from an oxygen annealing chamber into an ion milling chamber;
exposing the film directly to a focused ion beam, wherein the ion beam is configured to remove some or all portions of the film, allowing the film to form a functional structure;
passing the film back to the oxygen annealing chamber;
setting the film to a specific temperature and oxygen atmospheric pressure to achieve a final desired oxygen content.

2. The method of claim 1, wherein the step of exposing the film directly to a focused ion beam comprises exposing the film directly to an ion flood gun and a masked film.

3. The method of claim 2, wherein the step of exposing the film directly to an ion flood gun and a masked film comprises exposing the film directly to an ion flood gun and a lithographically hard-masked film.

4. The method of claim 1 further comprising the step of annealing the exposed portion of the film to a second oxygen state, wherein an oxygen content of the second oxygen state is greater than the oxygen content of the first oxygen state.

5. The method of claim 1 further comprising the step of annealing the exposed portion of the film to a second oxygen state, wherein an oxygen content of the second oxygen state is less than the oxygen content of the first oxygen state.

6. The method of claim 1, wherein the structure is a micro-structure.

7. The method of claim 1, wherein the structure is a nano-structure.

8. The method of claim 1, wherein the film comprises two or more discrete regions each having a different oxygen state having a different oxygen content.

9. The method of claim 1, wherein the trench is disposed along one of the length and the width of the film.

10. The method of claim 1, wherein the trench has a width of 1 mm.

11. The method of claim 1, wherein the trench has a depth of between about 325 nm and about 500 nm.

12. The method of claim 1, wherein the step of providing a film on a substrate comprises:
   growing the film on the substrate in an atmospheric chamber having a first oxygen atmospheric pressure, where $x \cong 7$;
   applying a uniaxial pressure to the film and the substrate; and
   annealing the film at a second oxygen atmospheric pressure, wherein the second atmospheric pressure is less than the first oxygen atmospheric pressure.

13. The method of claim 12, wherein the film is annealed until a linear thermal gradient appears across the film.

* * * * *